United States Patent
Li et al.

(10) Patent No.: US 11,386,841 B2
(45) Date of Patent: Jul. 12, 2022

(54) PIXEL DRIVING CIRCUIT, ARRAY SUBSTRATE AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Pan Li, Beijing (CN); Xueguang Hao, Beijing (CN); Chen Xu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/278,692

(22) PCT Filed: Jul. 30, 2020

(86) PCT No.: PCT/CN2020/105843
§ 371 (c)(1),
(2) Date: Mar. 23, 2021

(87) PCT Pub. No.: WO2021/031821
PCT Pub. Date: Feb. 25, 2021

(65) Prior Publication Data
US 2022/0036822 A1     Feb. 3, 2022

(30) Foreign Application Priority Data
Aug. 16, 2019  (CN) .......................... 201921333600.4

(51) Int. Cl.
G09G 3/3233     (2016.01)

(52) U.S. Cl.
CPC ... G09G 3/3233 (2013.01); *G09G 2300/0842* (2013.01)

(58) Field of Classification Search
CPC ............................................... G09G 2300/0842
See application file for complete search history.

(56) References Cited

U.S. PATENT DOCUMENTS

2015/0318313 A1     11/2015  Li et al.
2016/0211310 A1*    7/2016   Wang .................. H01L 51/5284
(Continued)

FOREIGN PATENT DOCUMENTS

CN     103354206 A     10/2013
CN     103413811 A     11/2013
(Continued)

*Primary Examiner* — Stacy Khoo
(74) *Attorney, Agent, or Firm* — Fay Sharpe LLP

(57) ABSTRACT

A pixel driving circuit, an array substrate and a display device are provided. The pixel driving circuit includes a first interlayer dielectric layer and a second interlayer dielectric layer. The first interlayer dielectric layer is arranged on the side of a gate layer lead away from a base substrate and is formed with a first via hole exposing the gate layer lead. The second interlayer dielectric layer is arranged on the side of the first interlayer dielectric layer away from the base substrate and is formed with a second via hole exposing the first via hole. A source drain layer lead is arranged on the side of the second interlayer dielectric layer away from the base substrate and is electrically connected to the gate layer lead through the first via hole and the second via hole.

20 Claims, 7 Drawing Sheets

(56) References Cited

U.S. PATENT DOCUMENTS

| | | | |
|---|---|---|---|
| 2016/0247834 A1 | 8/2016 | Li et al. | |
| 2016/0365364 A1* | 12/2016 | Li | H01L 29/417 |
| 2017/0186651 A1* | 6/2017 | Shi | H01L 27/1288 |
| 2019/0115405 A1 | 4/2019 | Heo et al. | |
| 2019/0355304 A1* | 11/2019 | Tanaka | G01K 1/14 |
| 2020/0043996 A1 | 2/2020 | Cheng | |
| 2021/0124226 A1 | 4/2021 | Cheng et al. | |

FOREIGN PATENT DOCUMENTS

| | | |
|---|---|---|
| CN | 207052608 U | 2/2018 |
| CN | 109817531 A | 5/2019 |
| CN | 109901338 A | 6/2019 |
| CN | 210110300 U | 2/2020 |

\* cited by examiner

A PIXEL DRIVING CIRCUIT, ARRAY SUBSTRATE AND DISPLAY DEVICE

The present disclosure is a 371 of PCT Application No. PCT/CN2020/105843, filed on Jul. 30, 2020, which claims priority to Chinese Utility Model Patent Application No. 201921333600.4, filed on Aug. 16, 2019 and entitled "Pixel driving circuit, array substrate and display device", the entire content of which is incorporated herein by reference.

TECHNICAL FIELD

The present disclosure relates to the field of display technology, and in particular, relates to a pixel driving circuit, an array substrate and a display device.

BACKGROUND

In a pixel driving circuit of a display device, some gate layer leads and some source drain layer leads need to be connected through via holes.

The information disclosed in the Related Art section is merely used for enhancing the understanding of the background of the present disclosure, and therefore, may include information that does not constitute existing technologies known to those of ordinary skill in the art.

SUMMARY

The present disclosure provides a pixel driving circuit, an array substrate and a display device.

According to one aspect of the present disclosure, provided is a pixel driving circuit, including:

a base substrate;

a gate layer lead, arranged on one side of the base substrate; and a source drain layer lead, electrically connected to the gate layer lead; wherein a position at which the source drain layer lead is electrically connected to the gate layer lead further includes:

a first interlayer dielectric layer, arranged on the side of the gate layer lead away from the base substrate, and formed with a first via hole exposing the gate layer lead;

and a second interlayer dielectric layer, arranged on the side of the first interlayer dielectric layer away from the base substrate, and formed with a second via hole exposing the first via hole; and the source drain layer lead is arranged on the side of the second interlayer dielectric layer away from the base substrate, and is electrically connected to the gate layer lead through the first via hole and the second via hole.

In an exemplary embodiment of the present disclosure, a slope angle of the first via hole is less than a slope angle of the second via hole.

In an exemplary embodiment of the present disclosure, the slope angle of the first via hole is between 20° and 45°, and/or the slope angle of the second via hole is between 45° and 90°.

In an exemplary embodiment of the present disclosure, an edge of the first via hole away from the base substrate overlaps with an edge of the second via hole close to the base substrate.

In an exemplary embodiment of the present disclosure, an orthographic projection of an edge of the second via hole close to the base substrate on the first interlayer dielectric layer encloses an edge of the first via hole away from the base substrate.

In an exemplary embodiment of the present disclosure, a slope angle of the first via hole is equal to a slope angle of the second via hole.

In an exemplary embodiment of the present disclosure, the slope angle of the first via hole is between 45° and 90°, and/or the slope angle of the second via hole is between 45° and 90°.

In an exemplary embodiment of the present disclosure, the material of the first interlayer dielectric layer or the second interlayer dielectric layer includes silicon nitride, silicon oxide or silicon oxynitride.

In an exemplary embodiment of the present disclosure, the pixel driving circuit further includes: a transistor, arranged on one side of the base substrate; and the gate layer lead is electrically connected to the transistor.

In an exemplary embodiment of the present disclosure, the transistor is a driver transistor, and a gate of the transistor is electrically connected to the gate layer lead;

the pixel driving circuit further includes a storage capacitor, the storage capacitor includes a first electrode plate, and the first electrode plate is electrically connected to the source drain layer lead.

In an exemplary embodiment of the present disclosure, the first electrode plate and an active layer of the driver transistor are arranged in the same layer and have the same material.

In an exemplary embodiment of the present disclosure, the storage capacitor further includes a second electrode plate, the second electrode plate and a gate layer of the driver transistor are arranged in the same layer and have the same material.

In an exemplary embodiment of the present disclosure, the transistor is a compensating transistor, and a source of the transistor is electrically connected to the gate layer lead;

the pixel driving circuit further includes a storage capacitor, the storage capacitor includes a second electrode plate, and the second electrode plate is electrically connected to a drain of the transistor.

According to another aspect of the present disclosure, provided is an array substrate, including a plurality of pixels, wherein each of the pixels includes the pixel driving circuit as described above and a light emitting element connected to the pixel driving circuit.

In an exemplary embodiment of the present disclosure, the plurality of pixels share one base substrate.

In an exemplary embodiment of the present disclosure, the light emitting element is an organic light emitting diode (OLED).

According to still another aspect of the present disclosure, a display device is provided, including the array substrate as described above and a driver circuit for driving pixels in the array substrate.

BRIEF DESCRIPTION OF THE DRAWINGS

The above-mentioned and other features and advantages of the present disclosure will become more apparent by describing in detail the exemplary implementations with reference to the accompanying drawings.

Figure 1:
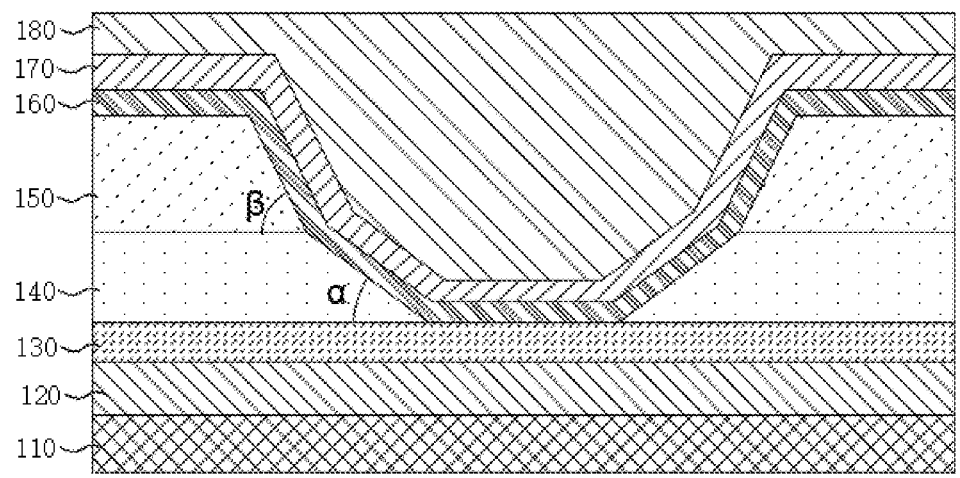
FIG. 1 is a schematic structural cross-sectional view of a position at which a source drain layer lead is connected to a gate layer lead in a pixel driving circuit according to an implementation of the present disclosure.

Main reference numerals in the figures are illustrated as follows.

110: base substrate; 120: insulating material layer; 130: gate layer lead; 131: gate layer connecting line; 132: first gate line; 133: second gate line; 134: compensation connecting lead; 140: first interlayer dielectric layer; 141: first via hole; 142: annular buffer surface; 150: second interlayer dielectric layer; 151: second via hole; 160: source drain layer lead; 161: source drain layer connecting line; 162: data line; 163: power line; 164: compensation line; 170: protective layer; 180: passivation layer; 191: pixel electrode; 200: driver transistor; 210: source of the driver transistor; 220: drain of the driver transistor; 230: gate of the driver transistor; 231: gate layer of the driver transistor; 240: active layer of the driver transistor; 241: channel area of the driver transistor; 242: source contact area of the driver transistor; 243: drain contact area of the driver transistor; 300: storage capacitor; 310: first electrode plate; 320: second electrode plate; 400: compensating transistor; 410: source of the compensating transistor; 420: drain of the compensating transistor; 430: gate of the compensating transistor; 431: gate layer of the compensating transistor; 440: active layer of the compensating transistor; 441: channel area of the compensating transistor; 442: source contact area of the compensating transistor; 443: drain contact area of the compensating transistor; 500: data writing transistor; 510: source of the data writing transistor; 520: drain of the data writing transistor; 530: gate of the data writing transistor; 531: gate layer of the data writing transistor; 540: active layer of the data writing transistor; 541: channel area of the data writing transistor; 542: source contact area of the data writing transistor; 543: drain contact area of the data writing transistor; 01: pixel; 011: pixel driving circuit; 012: light emitting element; 1000: array substrate; 2000: gate driver circuit; and 3000: source driver circuit.

DETAILED DESCRIPTION

Now, exemplary embodiments will be described more comprehensively with reference to the accompanying drawings. However, the example embodiments can be implemented in various forms, and should not be construed as being limited to the examples set forth herein. Conversely, the embodiments are provided to make the present disclosure more comprehensive and complete, and comprehensively convey the idea of the examples of the embodiments to those skilled in the art. The described features, structures or characteristics may be combined in one or more embodiments in any appropriate manner. In the following description, many specific details are provided to give a sufficient understanding of the embodiments of the present disclosure.

In the drawings, the thickness of the areas and layers may be exaggerated for clarity. The same reference numerals in the drawings denote the same or similar structures, so the detailed descriptions of the same or similar structures will be omitted.

The terms "first" and "second" are only used as markers, and are not intended to limit the number of objects.

In a pixel driving circuit of a display device, some gate layer leads and some source drain layer leads need to be connected through via holes. However, the thickness of the interlayer insulating layer between the gate layer lead and the source drain layer lead is relatively large and the slope angle of the via hole is relatively large, which causes the source drain layer lead to be prone to breakage, affecting the yield rate of the display device.

An implementation of the present disclosure provides a pixel driving circuit. As shown in FIG. 1 to FIG. 6, the pixel driving circuit includes a base substrate 110, a gate layer lead 130 and a source drain layer lead 160.

The gate layer lead 130 is arranged on one side of the base substrate 110. The source drain layer lead 160 is electrically connected to the gate layer lead 130. A position at which the source drain layer lead 160 is electrically connected to the gate layer lead 130 further includes:

a first interlayer dielectric layer 140, arranged on the side of the gate layer lead 130 away from the base substrate 110, and formed with a first via hole 141 exposing the gate layer lead 130; and a second interlayer dielectric layer 150, arranged on the side of the first interlayer dielectric layer 140 away from the base substrate 110, and formed with a second via hole 151 exposing the first via hole 141; The source drain layer lead 160 is arranged on the side of the second interlayer dielectric layer 150 away from the base substrate 110, and is electrically connected to the gate layer lead 130 through the first via hole 141 and the second via hole 151.

In the pixel driving circuit of the present disclosure, two via holes interconnected with each other are arranged between the source drain layer lead 160 and the gate layer lead 130 so as to connect the source drain layer lead 160 and the gate layer lead 130, which reduces the depth of a single via hole and avoids the defect that the depth of a single via hole is too large. For example, the breakage problem of the source drain layer lead 160 due to that the depth and the slope angle of a single via hole are too large can be avoided, thus improving the yield rate of the pixel driving circuit.

The components of the pixel driving circuit provided by the implementations of the present disclosure are described in detail below in conjunction with the accompanying drawings.

In the pixel driving circuit provided by the present disclosure, the first interlayer dielectric layer 140 and the second interlayer dielectric layer 150 may be arranged between the source drain layer lead 160 and the gate layer lead 130, and may have the same or different materials.

Optionally, the material of the first interlayer dielectric layer 140 may include silicon nitride, silicon oxide or silicon oxynitride.

Optionally, the material of the second interlayer dielectric layer 140 may include silicon nitride, silicon oxide or silicon oxynitride.

Figure 2:
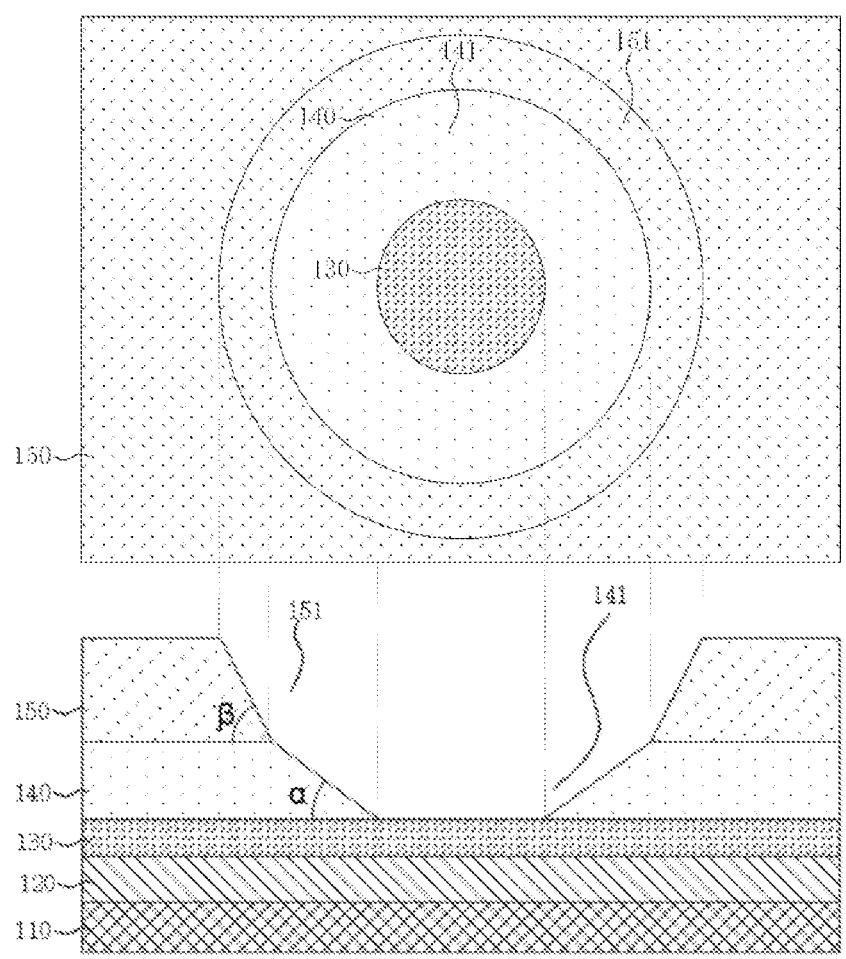
FIG. 2 is a schematic structural top and cross-sectional view of a first via hole and a second via hole according to an implementation of the present disclosure.
Figure 4:
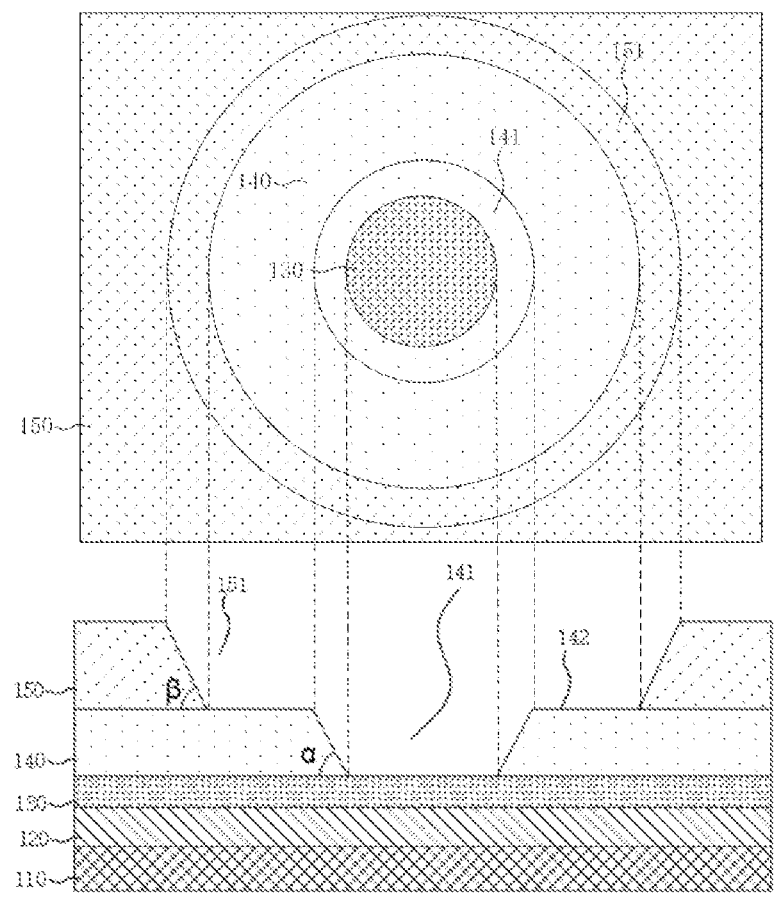
FIG. 4 is a schematic structural top and cross-sectional view of a first via hole and a second via hole according to an implementation of the present disclosure.

As shown in FIG. 2 and FIG. 4, when the first via hole 141 is formed in the first interlayer dielectric layer 140, the size of an edge of the first via hole 141 close to the base substrate 110 is less than the size of an edge of the first via hole 141 away from the base substrate 110, so that the first via hole 141 has a certain slope angle. The slope angle α of the first via hole 141 may be an angle between a side wall of the first via hole 141 and a plane where the base substrate 110 lies. That is, when the side wall of the first via hole 141 is perpendicular to the plane where the base substrate 110 lies, the slope angle α of the first via hole 141 is 90°.

Similarly, as shown in FIG. 2 and FIG. 4, when the second via hole 151 is formed in the second interlayer dielectric layer 150, the size of an edge of the second via hole 151 close to the base substrate 110 is less than the size of an edge of the second via hole 151 away from the base substrate 110, so that the second via hole 151 has a certain slope angle. The slope angle β of the second via hole 151 may be an angle between a side wall of the second via hole 151 and the plane where the base substrate 110 lies. That is, when the side wall of the second via hole 151 is perpendicular to the plane where the base substrate 110 lies, the slope angle β of the second via hole 151 is 90°.

In an implementation of the present disclosure, as shown in FIG. 1 and FIG. 2, the slope angle α of the first via hole 141 is less than the slope angle β of the second via hole 151. On the one hand, this can prevent the slope angle α of the first via hole 141 from being too large, thereby avoiding the problem that the depth and the slope angle of the first via hole 141 are too large and the source drain layer lead 160 breaks at the first via hole 141. On the other hand, the slope angle β of the second via hole 151 is greater than the slope angle α of the first via hole 141, thereby avoiding the problem that the size of the second via hole 151 is too large due to that the slope angle β of the second via hole 151 is too small. Therefore, this avoids the problem that the size of the second via hole 151 in the surface of the second interlayer dielectric layer 150 away from the base substrate 110 is too large, and reduces the size of the pixel driving circuit, making it convenient to improve the resolution (PPI) of an array substrate using the pixel driving circuit.

Optionally, the slope angle α of the first via hole 141 is between 20° and 45°, which is a relatively small slope angle. The first via hole 141 may be formed in the first interlayer dielectric layer 140 by dry etching, to ensure that the slope angle α of the first via hole 141 is relatively small.

Optionally, the slope angle β of the second via hole 151 is between 45° and 90°, which is a relatively large slope angle. The second via hole 151 may be formed in the second interlayer dielectric layer 150 by wet etching, to ensure that the slope angle β of the second via hole 151 is relatively large.

Optionally, the first interlayer dielectric layer 140 is formed by a low temperature process, and the second interlayer dielectric layer 150 is formed by a high temperature process. As such, the first interlayer dielectric layer 140 and the second interlayer dielectric layer 150 have different densities, and the slope angles of the first via hole 141 and the second via hole 151 are also different.

Optionally, as shown in FIG. 1 and FIG. 2, an edge of the first via hole 141 away from the base substrate 110 overlaps with an edge of the second via hole 151 close to the base substrate 110. As such, this can further ensure that the second via hole 151 has a relatively small size, thereby reducing the size of the pixel driving circuit.

Figure 3:
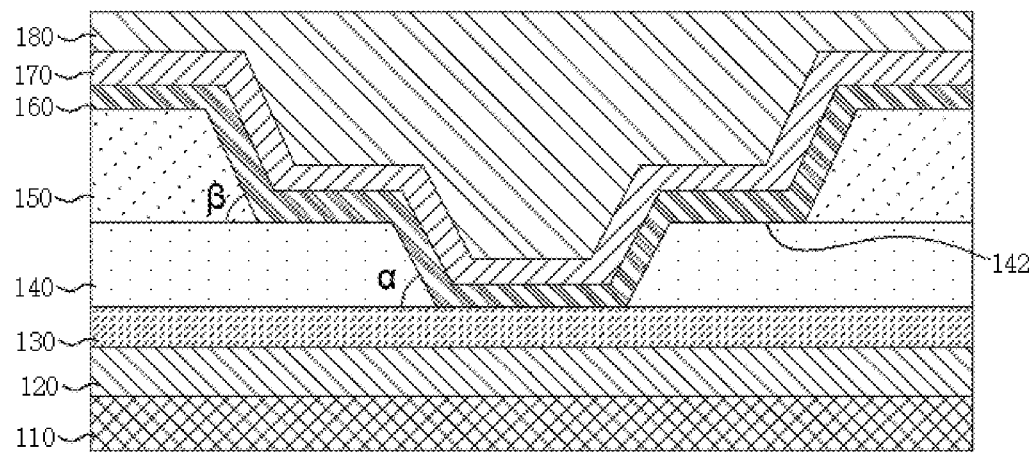
FIG. 3 is a schematic structural cross-sectional view of a position at which a source drain layer lead is connected to a gate layer lead in a pixel driving circuit according to an implementation of the present disclosure.

In another implementation of the present disclosure, as shown in FIG. 3 and FIG. 4, an orthographic projection of the edge of the second via hole 151 close to the base substrate 110 on the first interlayer dielectric layer 140 is located outside of the edge of the first via hole 141 away from the base substrate 110. That is to say, the orthographic projection of the edge of the second via hole 151 close to the base substrate 110 on the first interlayer dielectric layer 140 encloses the edge of the first via hole 141 away from the base substrate 110. As such, the second via hole 151 exposes the first via hole 141 and an annular buffer surface 142 surrounding the first via hole 141. The annular buffer surface 142 is part of the surface of the first interlayer dielectric layer 140 away from the base substrate 110. An outer edge of the annular buffer surface 142 is the edge of the second via hole 151 close to the base substrate 110, and an inner edge of the annular buffer surface 142 is the edge of the first via hole 141 away from the base substrate 110. The source drain layer lead 160 sequentially covers the surface of the second via hole 151, the annular buffer surface 142, the surface of the first via hole 141, and the exposed gate layer lead 130. Because the source drain layer lead 160 can cover the annular buffer surface 142, the source drain layer lead 160 does not need to pass through an excessively deep via hole, so that the stability of the source drain layer lead 160 can be improved, thereby improving the yield rate of the pixel driving circuit, and improving the yield rate of an array substrate using the pixel driving circuit.

Optionally, the slope angle α of the first via hole 141 is between 45° and 90°. As such, the first via hole 141 can have a relatively large slope angle, so as to reduce the size of the first via hole 141, i.e., to reduce the size of the edge of the first via hole 141 away from the base substrate 110. As such, this can correspondingly reduce the size of the second via hole 151, thereby reducing the size of the pixel driving circuit. Alternatively, the area of the annular buffer surface 142 may be increased on the premise that the size of the second via hole 151 remains unchanged, to further enhance the buffer effect of the annular buffer surface 142, thereby further enhancing the stability of the source drain layer lead 160 and improving the yield rate of the pixel driving circuit. Alternatively, the area of the annular buffer surface 142 may be increased while reducing the size of the second via hole 151.

Optionally, the slope angle β of the second via hole 151 is between 45° and 90°. As such, it can be ensured that the second via hole 151 has a relatively small size, thereby avoiding the problem that the size of the second via hole 151 is too large due to that the slope angle β of the second via hole 151 is too small.

Optionally, the slope angle α of the first via hole 141 and the slope angle β of the second via hole 151 may be the same to reduce the difficulty of preparing the first via hole 141 and the second via hole 151. For example, the first via hole 141 and the second via hole 151 may be simultaneously formed using a halftone mask.

Optionally, the pixel driving circuit provided by the present disclosure further includes a transistor, the transistor is located on one side of the base substrate 110, and the gate layer lead 130 is electrically connected to the transistor.

Figure 5:
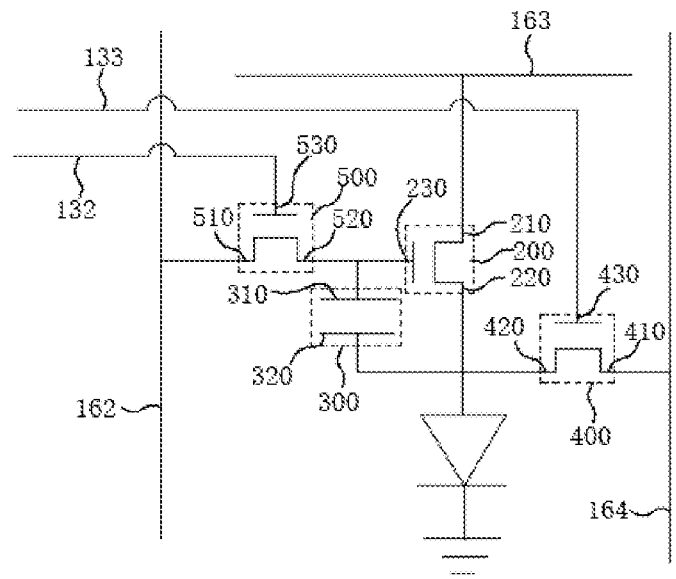
FIG. 5 is a schematic diagram of an equivalent circuit of a pixel driving circuit according to an implementation of the present disclosure.
Figure 6:
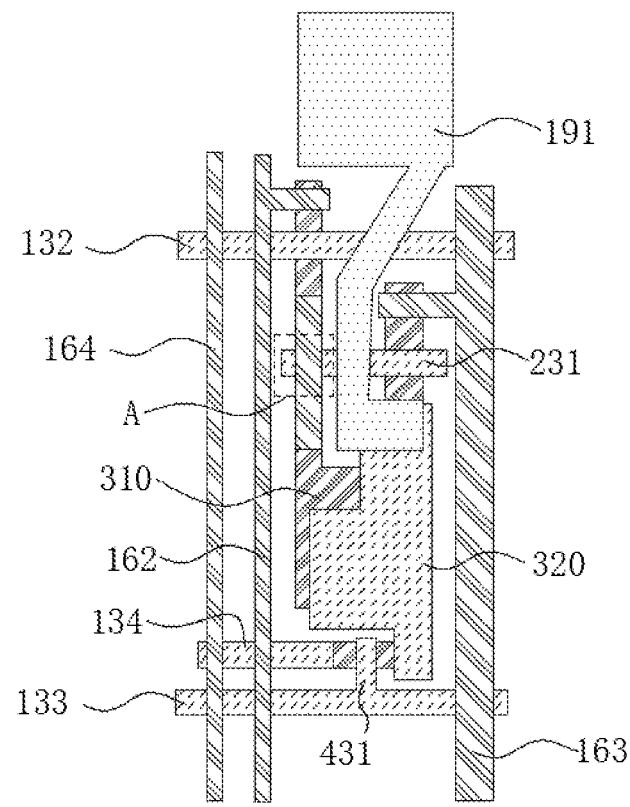
FIG. 6 is a schematic diagram of a hierarchical structure of a pixel driving circuit according to an implementation of the present disclosure.

As shown in FIG. 5 and FIG. 6, the pixel driving circuit may include a data writing transistor 500, a storage capacitor 300 and a driver transistor 200. The storage capacitor 300 includes a first electrode plate 310 and a second electrode plate 320 arranged opposite to each other. A source 510 of the data writing transistor 500 is electrically connected to a data line 162, a drain 520 of the data writing transistor 500 is electrically connected to the first electrode plate 310 of the storage capacitor 300, and a gate 530 of the data writing transistor 500 is electrically connected to a first gate line 132. A gate 230 of the driver transistor 200 is electrically connected to the first electrode plate 310 of the storage capacitor 300, a source 210 of the driver transistor 200 is electrically connected to a power line 163, and a drain 220 of the driver transistor 200 is electrically connected to a pixel electrode 191.

Optionally, as shown in FIG. 5 and FIG. 6, the pixel driving circuit may further include a compensating transistor 400. A drain 420 of the compensating transistor 400 is electrically connected to the second electrode plate 320 of the storage capacitor 300, a gate 430 of the compensating transistor 400 is electrically connected to a second gate line 133, and a source 410 of the compensating transistor 400 is electrically connected to a compensation line 164. The compensating transistor 400, the driver transistor 200, the data writing transistor 500 and the storage capacitor 300 are arranged on the same side of the base substrate 110.

In an implementation of the present disclosure, as shown in FIG. 6 to FIG. 9, the gate layer lead 130 is a gate layer connecting line 131, and the gate layer connecting line 131 is electrically connected to the gate 230 of the driver transistor 200; the source drain layer lead 160 is a source drain layer connecting line 161, and the source drain layer connecting line 161 is electrically connected to the first electrode plate 310, the gate layer connecting line 131 and the drain 520 of the data writing transistor 500.

In another implementation of the present disclosure, the gate layer lead 130 is a compensation connecting lead 134, and the compensation connecting lead 134 is electrically connected to the source 410 of the compensating transistor 400; the source drain layer lead 160 is a compensation line 164, and the compensation line 164 is electrically connected to the compensation connecting lead 134.

Optionally, as shown in FIG. 5, the driver transistor 200 may include the source 210, the gate 230 and the drain 220. the source 210 of the driver transistor 200 and the drain 220 of the driver transistor 200 may be of the same structure, so in other cases, the connection relationship between the source 210 of the driver transistor 200 and the drain 220 of the driver transistor 200 is interchangeable. In other words, the driver transistor 200 may have a first connecting terminal, a second connecting terminal and a control terminal. One of the first connecting terminal and the second connecting terminal may serve as the source 210 of the driver transistor 200, and the other may serve as the drain 220 of the driver transistor 200, with the control terminal being the gate 230 of the driver transistor 200.

Figure 9:
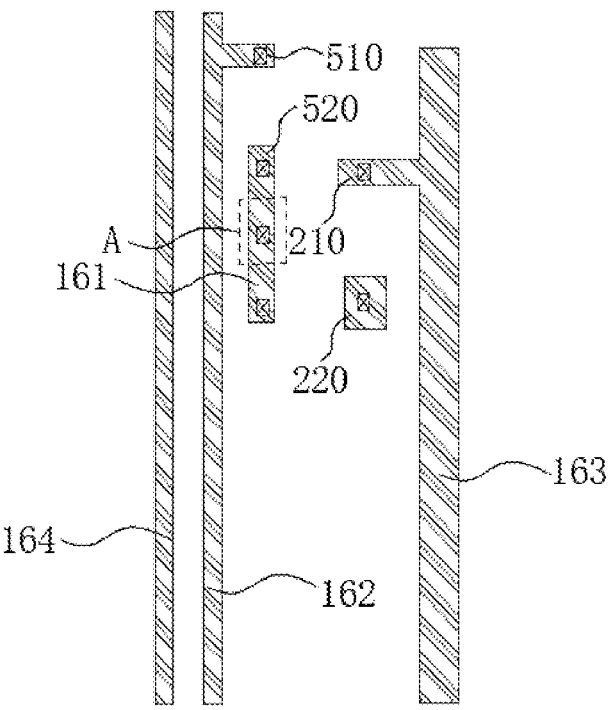
FIG. 9 is a schematic diagram showing a pattern of a source drain material layer of a pixel driving circuit according to an implementation of the present disclosure.

Optionally, as shown in FIG. 6 (only a pattern of an active material layer, a pattern of a gate material layer, a pattern of a source drain material layer and a pattern of an electrode material layer are shown) to FIG. 9, the driver transistor 200 may further include an active layer 240 of the driver transistor 200 arranged on one side of the base substrate 110, a gate insulating layer of the driver transistor 200 arranged on the side of the active layer 240 of the driver transistor 200 away from the base substrate 110, a gate layer 231 of the driver transistor 200 (serving as the gate 230 of the driver transistor 200) arranged on the side of the gate insulating layer of the driver transistor 200 away from the base substrate 110, and the source 210 of the driver transistor 200 and the drain 220 of the driver transistor 200 which are connected to the active layer 240 of the driver transistor 200 and insulated from each other.

Figure 7:
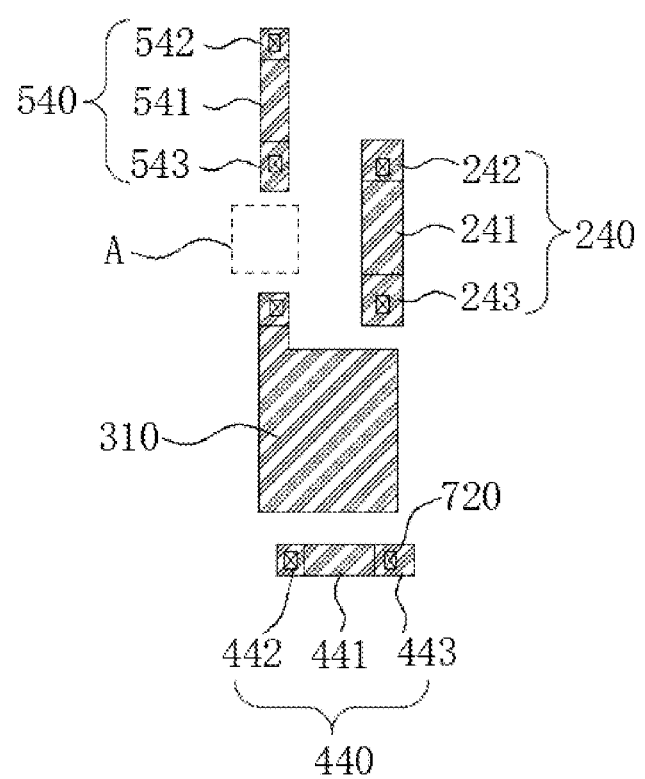
FIG. 7 is a schematic diagram showing a pattern of an active material layer of a pixel driving circuit according to an implementation of the present disclosure.

Optionally, as shown in FIG. 7, the active layer 240 of the driver transistor 200 may include a channel area 241 of the driver transistor 200 and a source contact area 242 of the driver transistor 200 and a drain contact area 243 of the driver transistor 200 that are located on two sides of the channel area 241 of the driver transistor 200. The gate insulating layer of the driver transistor 200 covers the channel area 241 of the driver transistor 200 and at least partially exposes the source contact area 242 of the driver transistor 200 and the drain contact area 243 of the driver transistor 200.

The first interlayer dielectric layer 140 may be arranged on the side of the gate layer 231 of the driver transistor 200 away from the base substrate 110. The second interlayer dielectric layer 150 may be arranged on the side of the first interlayer dielectric layer 140 away from the base substrate 110. The source 210 of the driver transistor 200 is arranged on the side of the second interlayer dielectric layer 150 away from the base substrate 110 and is connected to the source contact area 242 of the driver transistor 200 through a via hole. The drain 220 of the driver transistor 200 is arranged on the side of the second interlayer dielectric layer 150 away from the base substrate 110 and is connected to the drain contact area 243 of the driver transistor 200 through a via hole.

In other words, the pixel driving circuit of the present disclosure may include the base substrate 110, the active material layer, the insulating material layer 120, the gate material layer, the first interlayer dielectric layer 140, the second interlayer dielectric layer 150 and the source drain material layer, which are successively laminated. The active material layer is formed with the active layer 240 of the driver transistor 200. The insulating material layer 120 is formed with the gate insulating layer of the driver transistor 200. The gate material layer is formed with the gate layer 231 of the driver transistor 200, the gate layer connecting line 131, the first gate line 132, the second gate line 133 and the compensation connecting lead 134. The first interlayer dielectric layer 140 is formed with the first via hole 141, and the second interlayer dielectric layer 150 is formed with the second via hole 151. The source drain material layer is formed with the source 210 of the driver transistor 200, the drain 220 of the driver transistor 200, the source drain layer connecting line 161, the data line 162, the power line 163 and the compensation line 164.

Figure 8:
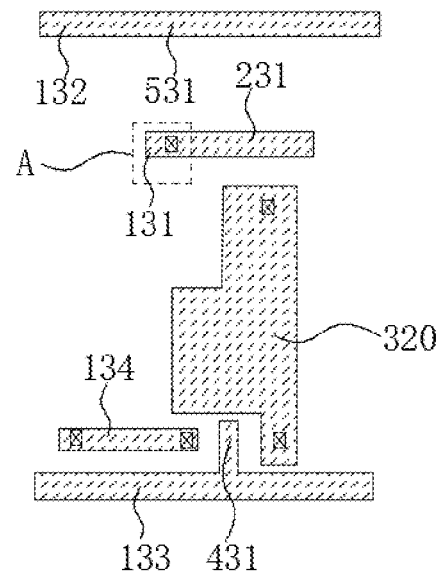
FIG. 8 is a schematic diagram showing a pattern of a gate material layer of a pixel driving circuit according to an implementation of the present disclosure.

Optionally, as shown in FIG. 6 to FIG. 8, the storage capacitor 300 may include the first electrode plate 310 arranged on one side of the base substrate 110, a dielectric layer of the storage capacitor 300 arranged on the side of the first electrode plate 310 away from the base substrate 110, and the second electrode plate 320 arranged on the side of the dielectric layer of the storage capacitor 300 away from the base substrate 110.

Optionally, as shown in FIG. 6 to FIG. 8, the first electrode plate 310 and the active layer 240 of the driver transistor 200 may be arranged in the same layer and have the same material. The second electrode plate 320 and the gate layer 231 of the driver transistor 200 may be arranged in the same layer and have the same material. The dielectric layer of the storage capacitor 300 and the gate insulating layer of the driver transistor 200 may be arranged in the same layer and have the same material. In other words, the active material layer may also be formed with the first electrode plate 310, the insulating material layer 120 may also be formed with the dielectric layer of the storage capacitor 300, and the gate material layer may also be formed with the second electrode plate 320.

Figure 10:
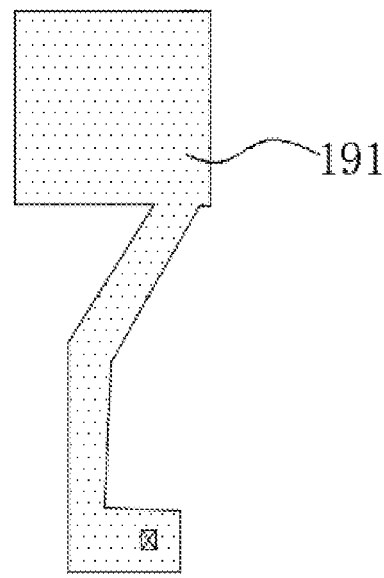
FIG. 10 is a schematic diagram showing a pattern of an electrode material layer of a pixel driving circuit according to an implementation of the present disclosure.

Optionally, as shown in FIG. 1 and FIG. 3, the pixel driving circuit may further include a passivation layer 180 and an electrode material layer. The passivation layer 180 is arranged on the side of the driver transistor 200 away from the base substrate 110. To be specific, the passivation layer 180 is arranged on the side of the source drain material layer away from the base substrate 110. The electrode material layer is arranged on the side of the passivation layer 180 away from the base substrate 110. As shown in FIG. 10, the electrode material layer is formed thereon with a pattern of the pixel electrode 191, and the pixel electrode 191 may be connected to the drain 220 of the driver transistor 200 through a via hole. Further, a protective layer 170 (PVX) may further be arranged between the source drain material layer and the passivation layer 180.

Optionally, as shown in FIG. 6 to FIG. 9, the compensating transistor 400 may include an active layer 440 of the compensating transistor 400 arranged on one side of the base substrate 110, a gate insulating layer of the compensating transistor 400 arranged on the side of the active layer 440 of the compensating transistor 400 away from the base substrate 110, and a gate layer 431 of the compensating transistor 400 (serving as the gate 430 of the compensating transistor 400) arranged on the side of the gate insulating layer of the compensating transistor 400 away from the base substrate 110. The active layer 440 of the compensating transistor 400 may include a channel area 441 of the compensating transistor 400 and a source contact area 442 of the compensating transistor 400 and a drain contact area 443 of the compensating transistor 400 that are located on two sides of the channel area 441 of the compensating transistor 400. The gate insulating layer of the compensating transistor 400 covers the channel area 441 of the compensating transistor 400 and at least partially exposes the source contact area 442 of the compensating transistor 400 and the drain contact area 443 of the compensating transistor 400. The source contact area 442 of the compensating transistor 400 may serve as the source 410 of the compensating transistor 400 and is configured to electrically connect to the compensation connecting lead 134, and the compensation connecting lead 134 may be electrically connected to the compensation line 164 through the first via hole and the second via hole. The drain contact area 443 of the compensating transistor 400 may serve as the drain 420 of the compensating transistor 400 and is configured to electrically connect to the second electrode plate 320 through a via hole.

As such, the active material layer may also be formed with the active layer 440 of the compensating transistor 400, the insulating material layer 120 may also be formed with the insulating layer of the gate 430 of the compensating transistor 400, and the gate material layer may also be formed with the gate layer 431 of the compensating transistor 400.

Optionally, as shown in FIG. 6 to FIG. 9, the data writing transistor 500 may include an active layer 540 of the data writing transistor 500 arranged on one side of the base substrate 110, a gate insulating layer of the data writing transistor 500 arranged on the side of the active layer 540 of the data writing transistor 500 away from the base substrate 110, a gate layer 531 of the data writing transistor 500 (serving as the gate 530 of the data writing transistor 500) arranged on the side of the gate insulating layer of the data writing transistor 500 away from the base substrate 110, and the source 510 of the data writing transistor 500 and the drain 520 of the data writing transistor 500 which are connected to the active layer 540 of the data writing transistor 500 and insulated from each other.

Optionally, the active layer 540 of the data writing transistor 500 may include a channel area 541 of the data writing transistor 500 and a source contact area 542 of the data writing transistor 500 and a drain contact area 543 of the data writing transistor 500 that are located on two sides of the channel area 541 of the data writing transistor 500. The gate insulating layer 530 of the data writing transistor 500 covers the channel area 541 of the data writing transistor 500 and at least partially exposes the source contact area 542 of the data writing transistor 500 and the drain contact area 543 of the data writing transistor 500. The first interlayer dielectric layer 140 and the second interlayer dielectric layer 150 may be arranged on the side of the gate layer 531 of the data writing transistor 500 away from the base substrate 110. The source 510 of the data writing transistor 500 is arranged on the side of the second interlayer dielectric layer 150 away from the base substrate 110 and is connected to the source contact area 542 of the data writing transistor 500 through a via hole. The drain 520 of the data writing transistor 500 is arranged on the side of the second interlayer dielectric layer 150 away from the base substrate 110 and is connected to the drain contact area 543 of the data writing transistor 500 through a via hole.

In other words, the active material layer may also be formed with the active layer 540 of the data writing transistor 500, and the insulating material layer 120 may also be formed with the gate insulating layer of the data writing transistor 500. The gate material layer may also be formed with the gate layer 531 of the data writing transistor 500. The source drain material layer may also be formed with the source 510 of the data writing transistor 500 and the drain 520 of the data writing transistor 500.

Figure 11:
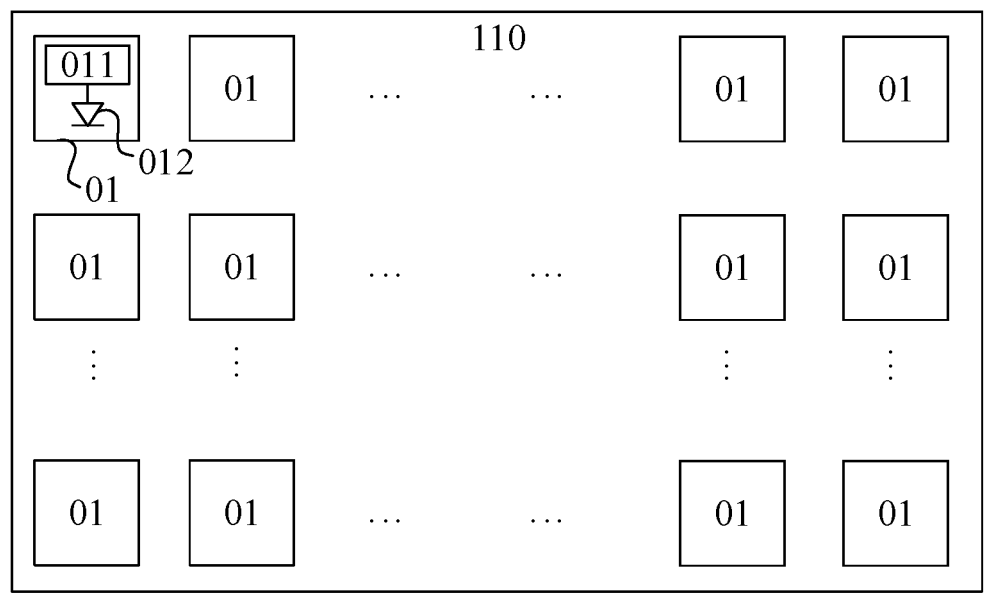
FIG. 11 is a schematic structural diagram of an array substrate according to an implementation of the present disclosure.

An implementation of the present disclosure further provides an array substrate. As shown in FIG. 11, the array substrate includes a plurality of pixels 01, wherein each of the pixels 01 includes any pixel driving circuit 011 as described in the above-mentioned implementation of the pixel driving circuit and a light emitting element 012 connected to the pixel driving circuit 011.

Optionally, the light emitting element 012 may be an OLED.

Optionally, referring to FIG. 11, the pixels 01 of the array substrate may share one base substrate 110. Because the array substrate has any pixel driving circuit as described in the above-mentioned implementation of the pixel driving circuit, it has the same beneficial effects, which will not be repeated in this disclosure.

Figure 12:
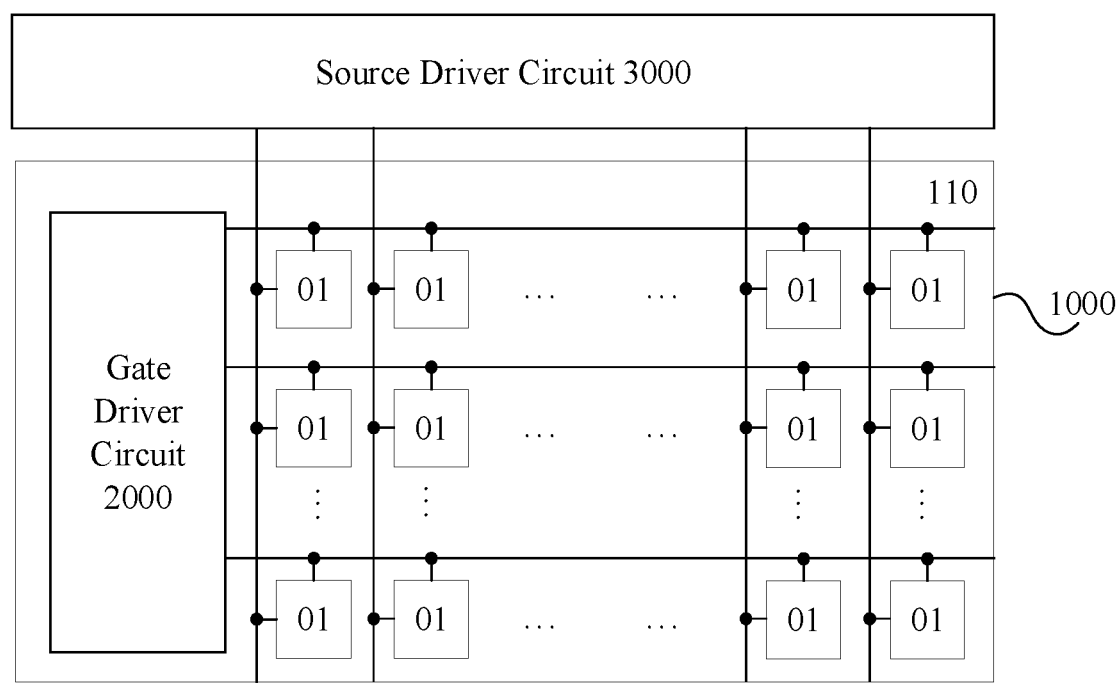
FIG. 12 is a schematic structural diagram of a display device according to an implementation of the present disclosure.

An implementation of the present disclosure further provides a display device. As shown in FIG. 12, the display device includes any array substrate 1000 as described in the above-mentioned implementation of the array substrate, and a driver circuit for driving pixels 01 in the array substrate 1000. As shown in FIG. 12, the driver circuit may include a gate driver circuit 2000 and a source driver circuit 3000.

The gate driver circuit 2000 may be connected to each row of pixels 01 to provide a gate drive signal to each row of pixels 01. The source driver circuit 3000 may be connected to each column of pixels 01 to provide a data signal to each column of pixels 01.

Optionally, the display device may be an OLED display device, an LCD or any other type of display device. Because the display device has any array substrate as described in the above-mentioned implementation of the array substrate, it has the same beneficial effects, which will not be repeated in this disclosure.

It should be understood that the term "and/or" can indicate three kinds of relationship. For example, A and/or B, can be expressed as: A exists alone, A and B exist concurrently, B exists alone. The character "/" generally indicates that the context object is an "OR" relationship.

Correspondingly, it can be understood that the present disclosure does not limit its application to the detailed structures and configurations of the components proposed in this specification. The present disclosure can have other embodiments, and can be implemented and executed in various ways. The aforementioned variations and modifications fall within the scope of the present disclosure. It should be understood that the present disclosure disclosed and defined in this specification extends to all alternative combinations of two or more individual features mentioned or obvious in this specification and/or the accompanying drawings. All these different combinations constitute various alternative aspects of the present disclosure. The implementations described in this specification illustrate exemplary ways known to implement the present disclosure, and will enable those skilled in the art to utilize the present disclosure.

What is claimed is:

1. A pixel driving circuit, comprising:
   a base substrate;
   a gate layer lead, arranged on a side of the base substrate;
   a first interlayer dielectric layer, arranged on a side of the gate layer lead away from the base substrate, and formed with a first via hole exposing a contact area of the gate layer lead;
   a second interlayer dielectric layer, arranged on a side of the first interlayer dielectric layer away from the base substrate, and formed with a second via hole exposing the first via hole; and
   a source drain layer lead, arranged on a side of the second interlayer dielectric layer away from the base substrate, and electrically connected to the gate layer lead through the first via hole and the second via hole;
   wherein the first interlayer dielectric layer and the second interlayer dielectric layer are formed with the same material by different processes in order to have different densities, so that the first via hole and the second via hole are formed to have different slope angles.

2. The pixel driving circuit according to claim 1, wherein a slope angle of the first via hole is less than a slope angle of the second via hole.

3. The pixel driving circuit according to claim 2, wherein the slope angle of the first via hole is between 20° and 45°.

4. The pixel driving circuit according to claim 2, wherein the slope angle of the second via hole is between 45° and 90°.

5. The pixel driving circuit according to claim 2, wherein an edge of the first via hole away from the base substrate overlaps with an edge of the second via hole close to the base substrate.

6. The pixel driving circuit according to claim 1, wherein an orthographic projection of an edge of the second via hole close to the base substrate on the first interlayer dielectric layer encloses an edge of the first via hole away from the base substrate.

7. The pixel driving circuit according to claim 6, wherein a slope angle of the first via hole is equal to a slope angle of the second via hole.

8. The pixel driving circuit according to claim 6, wherein a slope angle of at least one of the first via hole and the second via hole is between 45° and 90°.

9. The pixel driving circuit according to claim 1, wherein a material of the first interlayer dielectric layer and the second interlayer dielectric layer comprises silicon nitride, silicon oxide or silicon oxynitride.

10. The pixel driving circuit according to claim 1, wherein the pixel driving circuit further comprises: a transistor, arranged on a side of the base substrate; and
    the gate layer lead is electrically connected to the transistor.

11. The pixel driving circuit according to claim 1, wherein the pixel driving circuit further comprises a driver transistor arranged on a side of the base substrate, and a gate of the driver transistor is electrically connected to the gate layer lead.

12. The pixel driving circuit according to claim 11, wherein the pixel driving circuit further comprises a storage capacitor, the storage capacitor comprises a first electrode plate, and the first electrode plate is electrically connected to the source drain layer lead.

13. The pixel driving circuit according to claim 12, wherein the first electrode plate and an active layer of the driver transistor are arranged in the same layer and have the same material.

14. The pixel driving circuit according to claim 12, wherein the storage capacitor further comprises a second electrode plate, and the second electrode plate and a gate layer of the driver transistor are arranged in the same layer and have the same material.

15. The pixel driving circuit according to claim 1, wherein the pixel driving circuit further comprises a compensating transistor arranged on a side of the base substrate, and a source of the compensating transistor is electrically connected to the gate layer lead.

16. The pixel driving circuit according to claim 15, wherein the pixel driving circuit further comprises a storage capacitor, the storage capacitor comprises a second electrode plate, and the second electrode plate is electrically connected to a drain of the compensating transistor.

17. An array substrate, comprising a plurality of pixels, wherein each of the pixels comprises the pixel driving circuit according to claim 1 and a light emitting element connected to the pixel driving circuit.

18. The array substrate according to claim 17, wherein the plurality of pixels share the same base substrate.

19. The array substrate according to claim 17, wherein the light emitting element is an organic light emitting diode.

20. A display device, comprising the array substrate according to claim 17 and a driver circuit for driving pixels in the array substrate.

* * * * *